United States Patent
Sakakura et al.

(10) Patent No.: US 10,197,649 B2
(45) Date of Patent: Feb. 5, 2019

(54) GRADIENT MAGNETIC-FIELD COIL AND MAGNETIC-RESONANCE IMAGING APPARATUS

(71) Applicant: Toshiba Medical Systems Corporation, Otawara-shi (JP)

(72) Inventors: Yoshitomo Sakakura, Nasushiobara (JP); Yukiko Nishikawa, Otawara (JP); Masatoshi Yamashita, Utsunomiya (JP); Tetsuya Kobayashi, Otawara (JP)

(73) Assignee: Toshiba Medical Systems Corporation, Otawara-shi (JP)

( * ) Notice: Subject to any disclaimer, the term of this patent is extended or adjusted under 35 U.S.C. 154(b) by 596 days.

(21) Appl. No.: 14/667,910

(22) Filed: Mar. 25, 2015

(65) Prior Publication Data
US 2015/0276896 A1 Oct. 1, 2015

(30) Foreign Application Priority Data

Mar. 25, 2014 (JP) ................. 2014-062434

(51) Int. Cl.
*G01R 33/34* (2006.01)
*G01R 33/385* (2006.01)

(52) U.S. Cl.
CPC ................ *G01R 33/3858* (2013.01)

(58) Field of Classification Search
CPC .............. G01R 33/34; G01R 33/3858
USPC ....................................... 324/322
See application file for complete search history.

(56) References Cited

U.S. PATENT DOCUMENTS

| 6,525,536 B2 * | 2/2003 | Minas ................. G01R 33/385 324/318 |
| 2009/0261831 A1 | 10/2009 | Harter et al. |
| 2015/0153429 A1 * | 6/2015 | Peng ................. G01R 33/3858 324/322 |

FOREIGN PATENT DOCUMENTS

| GB | 2409522 A * | 6/2005 | ........... G01R 33/385 |
| JP | 2009-201980 | 9/2009 | |

OTHER PUBLICATIONS

Office Action dated Sep. 4, 2018, in corresponding Japanese Patent Application No. 2015-062689.

* cited by examiner

*Primary Examiner* — Melissa Koval
*Assistant Examiner* — Courtney McDonnough
(74) *Attorney, Agent, or Firm* — Oblon, McClelland, Maier & Neustadt, L.L.P.

(57) ABSTRACT

A gradient magnetic-field coil according to an embodiment includes multiple units of coil members and a connecting member. In each of the coil members, a coil pattern is formed with a first nonmagnetic metal. The connecting member connects the coil members with each other. Moreover, at least a part of the connecting member is formed with a second nonmagnetic metal that is different from the first nonmagnetic metal.

18 Claims, 11 Drawing Sheets

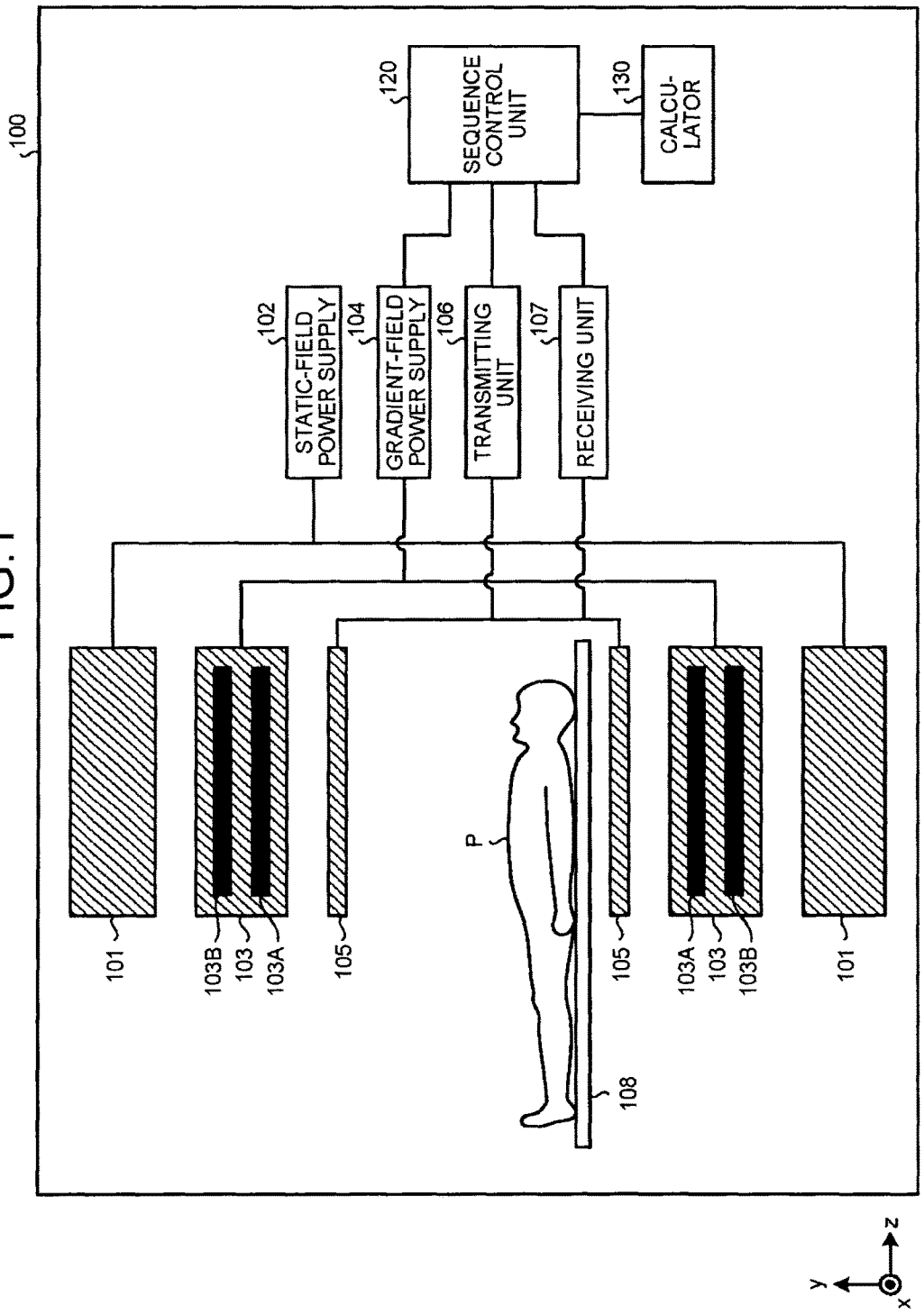

GRADIENT MAGNETIC-FIELD COIL AND MAGNETIC-RESONANCE IMAGING APPARATUS

CROSS-REFERENCE TO RELATED APPLICATIONS

This application is based upon and claims the benefit of priority from Japanese Patent Application No. 2014-062434, filed on Mar. 25, 2014, the entire contents of all of which are incorporated herein by reference.

FIELD

Embodiments described herein relate generally to a gradient magnetic-field coil and a magnetic-resonance imaging apparatus.

BACKGROUND

Magnetic resonance imaging (MRI) is an imaging technique in which nuclear spins of a subject that is placed in a static magnetic field are magnetically excited by radio frequency (RF) pulses at Larmor frequency thereof, and an image is generated from data of a magnetic resonance signal that is generated with the excitation.

A magnetic-resonance imaging apparatus has a gradient magnetic coil to generate a gradient magnetic field in an imaging space in which a subject to be imaged is placed. This gradient magnetic field coil generally includes a coil member that is made from copper as a conductor to generate a magnetic field.

BRIEF DESCRIPTION OF THE DRAWINGS

FIG. 1 is a functional block diagram indicating a configuration of an MRI apparatus according to a present embodiment;

DETAILED DESCRIPTION

Figure 2A:
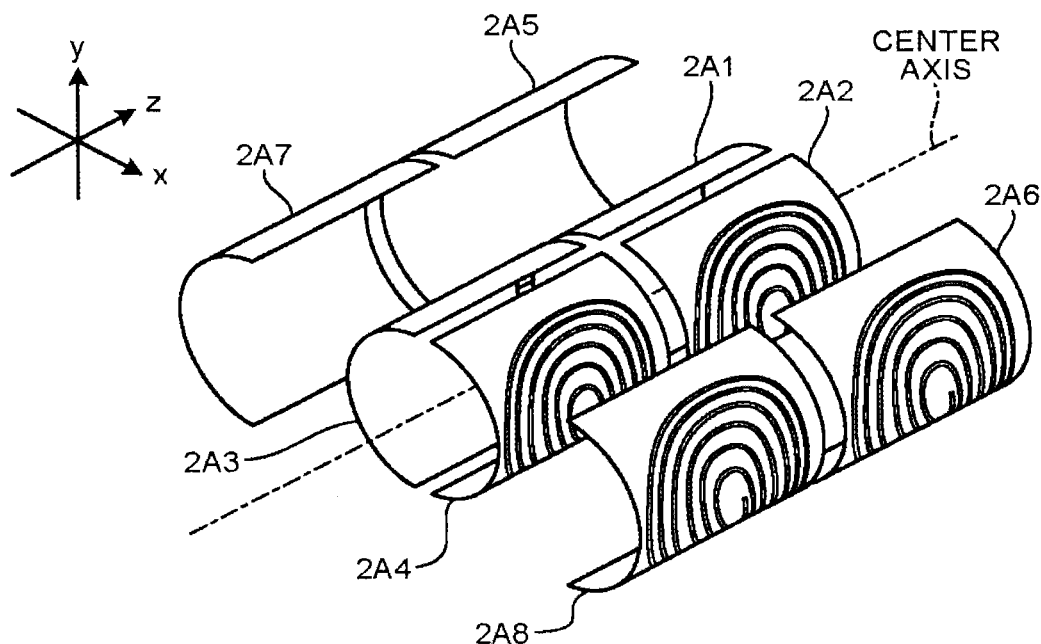
FIG. 2A is a diagram indicating one example of a structure of an X coil according to the present embodiment.

A gradient magnetic-field coil according to an embodiment includes multiple units of coil members and a connecting member. For each of the coil members, a coil pattern is formed with a first nonmagnetic metal. The connecting member connects the coil members with each other. Moreover, as for the connecting member, at least a part thereof is formed with a second nonmagnetic metal that is a different kind from the first nonmagnetic metal.

The gradient magnetic-field coil and a magnetic-resonance imaging apparatus according to the embodiment are explained below with reference to the drawings.

Configuration of MRI Apparatus 100

FIG. 1 is a functional block diagram indicating a configuration of an MRI apparatus 100 according to the present embodiment. Hereinafter, a magnetic-resonance imaging apparatus is referred to as an MRI apparatus.

As indicated in FIG. 1, the MRI apparatus 100 includes a static field magnet 101, a static-field power supply 102, a gradient magnetic-field coil 103, a gradient-field power supply 104, an RF coil 105, a transmitting unit 106, a receiving unit 107, a bed 108, a sequence control unit 120, and a calculator 130. Note that a subject P (for example, human body) is not included in the MRI apparatus 100. Furthermore, the configuration indicated in FIG. 1 is only one example. The respective components may be integrated or separated appropriately.

The static field magnet 101 is a magnet that is formed in a hollow and substantially cylindrical shape, and generates a static magnetic field in a space inside the cylinder. The static field magnet 101 is, for example, a superconducting magnet, or the like, and receives supply of electric current from the static-field power supply 102 to be energized. The static-field power supply 102 supplies electric current to the static field magnet 101. The static field magnet 101 may also be a permanent magnet, and in this case, the MRI apparatus 100 is not required to have the static-field power supply 102. Moreover, the static-field power supply 102 may be arranged separately from the MRI apparatus 100. Furthermore, the substantially cylindrical shape is not only a cylindrical shape in a perfect circle, but also includes a cylindrical shape in an ellipse that is distorted within a range not seriously impairing functions of the MRI apparatus 100.

The gradient magnetic-field coil 103 is arranged inside the static field magnet 101, and is a coil formed in a hollow and substantially cylindrical shape. The gradient magnetic-field coil 103 receives supply of electric current from the gradient-field power supply 104 to generate a gradient magnetic field the intensity of which varies along each axis direction of an x axis, a y axis, and a z axis. For example, the gradient magnetic-field coil 103 is an actively shielded gradient coil (ASGC) that has a main coil 103A and a shield coil 103B as indicated in FIG. 1. The main coil 103A generates a gradient magnetic field in a space inside the cylinder. Furthermore, the shield coil 103B is arranged on an outer periphery side of the main coil 103A, and cancels a leakage magnetic field of the main coil 103A. The main coil 103A and the shield coil 103B are formed by combining three coils corresponding to the respective axes of the x axis, the y axis, and the z axis that are perpendicular to each other.

Figure 2B:
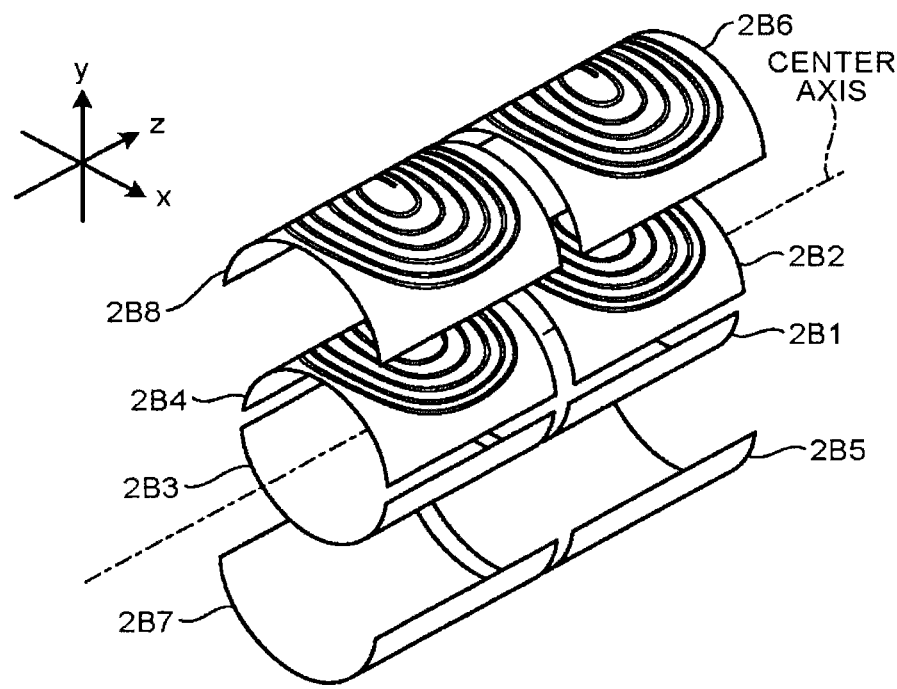
FIG. 2B is a diagram indicating one example of a structure of a Y coil according to the present embodiment.
Figure 2C:
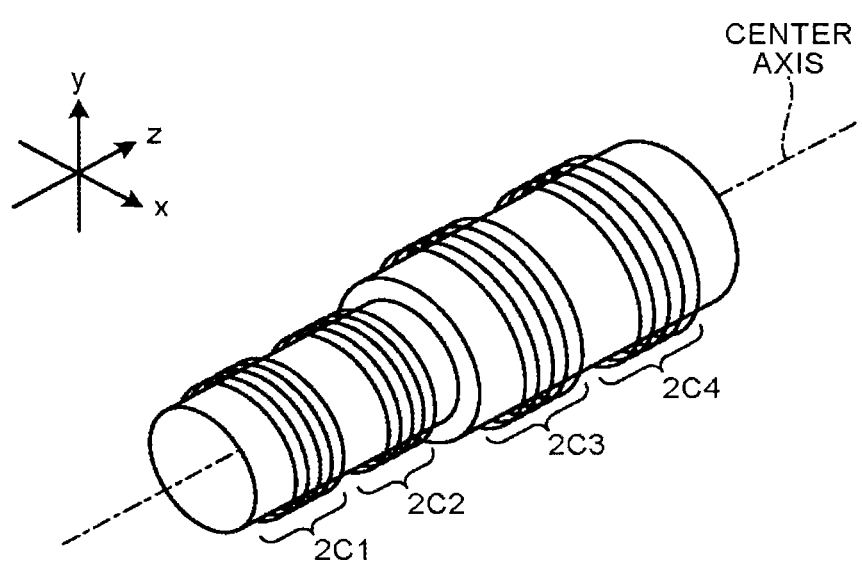
FIG. 2C is a diagram indicating one example of a structure of a Z coil according to the present embodiment.

A structure of the gradient magnetic-field coil 103 according to the present embodiment is explained using FIG. 2A to FIG. 2C. FIG. 2A is a diagram indicating one example of a structure of an X coil according to the present embodiment. FIG. 2B is a diagram indicating one example of a structure of a Y coil according to the present embodiment. FIG. 2C is a diagram indicating one example of a structure of a Z coil according to the present embodiment.

As indicated in FIG. 2A, the gradient magnetic-field coil 103 has four units of coil members 2A1, 2A2, 2A3, and 2A4 as the X coil of the main coil 103A on the inner layer side closer in distance to a center axis of the cylinder. Moreover, the gradient magnetic-field coil 103 has four units of coil members 2A5, 2A6, 2A7, and 2A8 as the X coil of the shield coil 103B on the outer layer side of the main coil 103A. Each of the coil members 2A1, 2A2, 2A3, 2A4, 2A5, 2A6, 2A7, and 2A8 is formed by processing (for example, cutting, edging, and the like) a spiral pattern (coil pattern) on a conductive plate, for example.

As indicated in FIG. 2B, the gradient magnetic-field coil 103 has four units of coil members 2B1, 2B2, 2B3, and 2B4 as the Y coil of the main coil 103A on the inner layer side. Moreover, the gradient magnetic-field coil 103 has four units of coil members 2B5, 2B6, 2B7, and 2B8 as the Y coil of the shield coil 103B on the outer layer side of the main coil 103A. Each of the coil members 2B1, 2B2, 2B3, 2B4, 2B5, 2B6, 2B7, and 2B8 is formed by processing a spiral pattern on a conductive plate, for example, similarly to the X coil.

As indicated in FIG. 2C, the gradient magnetic-field coil 103 has two units of coil members 2C1 and 2C2 as the Z coil of the main coil 103A on the inner layer side. Moreover, the gradient magnetic-field coil 103 has two units of coil members 2C3 and 2C4 as the Z coil of the shield coil 103B on the outer layer side of the main coil 103A. Each of the coil members 2C1, 2C2, 2C3, and 2C4 is formed, for example, by coiling a conductive wire into a spiral form.

Although the X coil, the Y coil, and the Z coil are illustrated separately in FIG. 2A to FIG. 2C, the respective coils are formed in such a manner that the coils are layered and unified by resin in the actual state. For example, in the gradient magnetic-field coil 103, the X coil, the Y coil, and the Z coil of the main coil 103A are sequentially layered from the inner layer side, and the X coil, the Y coil, and the Z coil of the shield coil 103B are layered on further outer layer side. This sequence is only an example, and may be changed appropriately.

Furthermore, in the following, the respective coil members 2A1, 2A2, 2A3, 2A4, 2A5, 2A6, 2A7, and 2A8 included in the X coil are referred to as a "coil member 2A" when generally referred without distinguishing each. Moreover, the respective coil members 2B1, 2B2, 2B3, 2B4, 2B5, 2B6, 2B7, and 2B8 included in the Y coil are referred to as a "coil member 2B" when generally referred without distinguishing each. Furthermore, the respective coil members 2C1, 2C2, 2C3, and 2C4 included in the Z coil are referred to as a "coil member 2C" when generally referred without distinguishing each. Moreover, the X coil member 2A, the Y coil member 2B, and the Z coil member 2C are referred to as a "coil member 2" when generally referred without distinguishing each.

Explanation returns to FIG. 1. The RF coil 105 is arranged inside the gradient magnetic-field coil 103, and receives supply of RF pulses from the transmitting unit 106 to generate a high-frequency magnetic field. Furthermore, the RF coil 105 receives a magnetic resonance signal (hereinafter, "MR signal" as appropriate) that is output from the subject P by influence of the high-frequency magnetic field, and outputs the received MR signal to the receiving unit 107.

The RF coil 105 described above is only one example. The RF coil 105 is only required to be configured with one, or by combining ones of a coil having only a transmitting function, a coil having only a receiving function, and a coil having a transmitting and receiving functions.

The transmitting unit. 106 supplies, to the RF coil 105, RF pulses corresponding to Larmor frequency that is determined by a type of atom and the intensity of a magnetic field to be a subject. The receiving unit 107 detects an MR signal that is output from the RF coil 105, and generates MR data based on the detected MR signal. Specifically, the receiving unit 107 generates MR data by performing digital conversion on the MR signal output from the RF coil 105. Furthermore, the receiving unit 107 transmits the generated MR data to the sequence control unit 120. The receiving unit 107 may be equipped on a mount unit side that includes the static field magnet 101, the gradient magnetic-field coil 103, and the like.

The bed 108 includes a top panel on which the subject P is mounted. In FIG. 1, only this top plate is illustrated for convenience of explanation. Generally, the bed 108 is arranged such that a direction of length thereof is parallel the center axis of the cylinder of the static field magnet 101. Moreover, the top plate is movable in the direction of length and a direction of height, and is inserted into a space in the cylinder inside the RE coil 105 in a state in which the subject P is mounted.

The sequence control unit 120 performs imaging of the subject P by driving the gradient-field power supply 104, the transmitting unit 106, and the receiving unit 107 based on sequence information that is transmitted from the calculator 130. The sequence information is information defining a procedure to perform imaging. In the sequence information, the intensity of electric current to be supplied to the gradient magnetic-field coil 103 by the gradient-field power supply 104 and timing of supplying the electric current, the intensity of RF pulses to be supplied to the RF coil 105 by the transmitting unit 106 and timing of supplying the RE pulses, timing of detecting an MR signal by the receiving unit 107, and the like are defined.

For example, the sequence control unit 120 is an integrated circuit such as an application specific integrated circuit (ASIC), a field programmable gate array (FPGA), or is an electric circuit such as a central processing unit (CPU), and a micro processing unit (MPU).

Receiving MR data from the receiving unit 107 as a result of imaging the subject P by driving the gradient-field power supply 104, the transmitting unit 106, and the receiving unit 107, the sequence control unit 120 transfers the received MR data to the calculator 130.

The calculator 130 controls the entire MRI apparatus 100. Moreover, the calculator 130 performs generation of an MR image and the like by performing reconstruction processing such as Fourier transform on the MR data that has been transferred from the sequence control unit 120. For example, the calculator 130 includes a control unit, a storage unit, an input unit, and a display unit. The control unit is an integrated circuit such as an ASIC and a FPGA, or an electric circuit such as a CPU and a MPU. The storage unit is a semiconductor memory device such as a random access memory (RAM) and a flash memory, a hard disk drive, an optical disk, or the like. The input unit is a pointing device such as a mouse and a trackball, a selecting device such as a mode switch, or an input device such as a keyboard. The display unit is a display device such as a liquid crystal display.

As above, one example of the configuration of the MRI apparatus 100 according to the present embodiment is explained. Based on such a configuration, in the MRI apparatus 100, a gradient magnetic-field coil can be formed lightweight.

Generally, in an MRI apparatus, each coil member forming a gradient magnetic-field coil is formed with copper having high conductivity. On the other hand, in the MRI apparatus 100 according to the present embodiment, each coil member of the gradient magnetic-field coil 103 is formed with aluminum. Therefore, according to the present embodiment, it is possible to form the gradient magnetic-field coil 103 lightweight and at low cost. Moreover, aluminum is generally less expensive than copper. Therefore, according to the present embodiment, it is possible to form the gradient magnetic-field coil 103 lightweight and at low cost.

Structures of the X coil and the Y coil according to the present embodiment are explained using FIG. 3A to FIG. 8, and a structure of the Z coil according to the present embodiment is explained using FIG. 9 and FIG. 1C) below.

Structures of X Coil and Y Coil

Figure 3A:
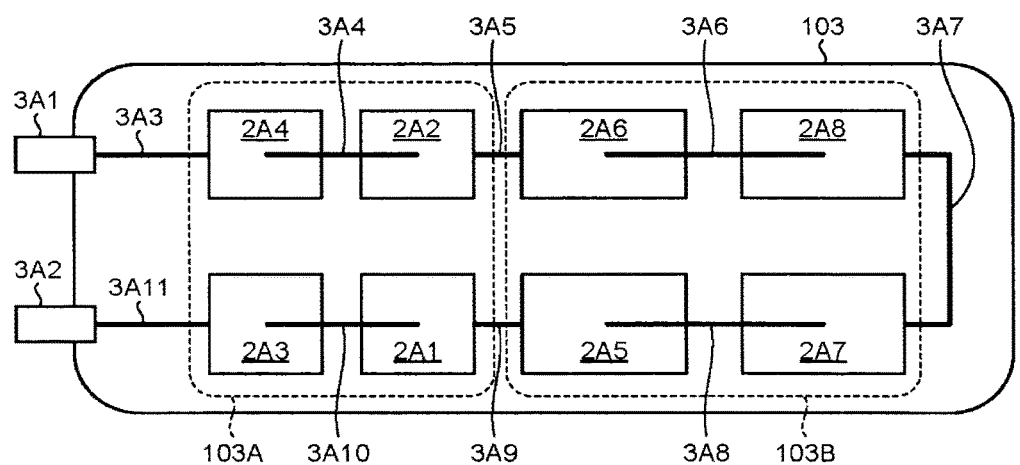
FIG. 3A is a diagram for explaining connection of each coil member in the X coil according to the present embodiment.
Figure 3B:
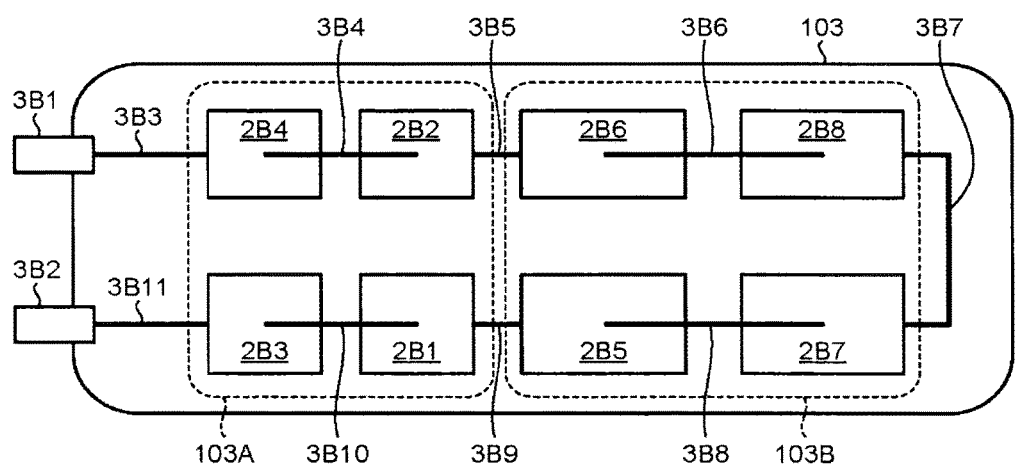
FIG. 3B is a diagram for explaining connection of each coil member in the Y coil according to the present embodiment.

FIG. 3A is a diagram for explaining connection of each coil member in the X coil according to the present embodiment. FIG. 3B is a diagram for explaining connection of each coil member in the Y coil according to the present embodiment. In FIG. 3A and FIG. 3B, connection relation of the respective coil members 2A and 2B is schematically indicated.

As indicated in FIG. 3A, the respective coil members 2A are connected to the gradient-field power supply 104 through terminals 3A1 and 3A2. Moreover, the respective coil members 2A are connected in series through crossover tracks 3A3, 3A4, 3A5, 3A6, 3A7, 3A8, 3A9, 3A10, and 3A11. Among these, the respective crossover tracks 3A4, 3A6, 3A8, and 3A10 connect central portions of spirals of the respective coil members 2A with each other. Furthermore, the respective crossover tracks 3A3, 3A5, 3A7, 3A9, and 3A11 connect ends of the respective coil members 2A with each other (or ends of the coil members 2A with ends of the terminals 3A1 and 3A2, respectively). In the following, the respective crossover tracks 3A3, 3A4, 3A5, 3A6, 3A7, 3A8, 3A9, 3A10, and 3A11 that connect the respective coil members 2A are referred to as a "crossover track 3A" when generally referred without distinguishing each. Moreover, the crossover track 3A is also referred to as a connecting wire, and is one example of a connecting member.

As indicated in FIG. 3B, the respective coil members 2B are connected to the gradient-field power supply 104 through terminals 3B1 and 3B2. Furthermore, the respective coil members 2B are connected in series through crossover tracks 3B3, 3B4, 3B5, 3B6, 3B7, 3B8, 3B9, 3B10, and 3B11. Among these, the respective crossover tracks 3B4, 3B6, 3B8, and 3B10 connect central portions of spirals of the respective coil members 2B with each other. Furthermore, the respective crossover tracks 3B3, 3B5, 3B7, 3B9, and 3B11 connect ends of the respective coil members 2B with each other (or ends of the coil members 2B with ends of the terminals 3B1 and 3B2, respectively). In the following, the respective crossover tracks 3B3, 3B4, 385, 3B6, 3B7, 3B8, 3B9, 3B10, and 3B11 that connect the respective coil members 22 are referred to as a "crossover track 3B" when generally referred without distinguishing each. Moreover, the crossover track 3B is also referred to as a connecting wire, and is one example of a connecting member.

Figure 4:
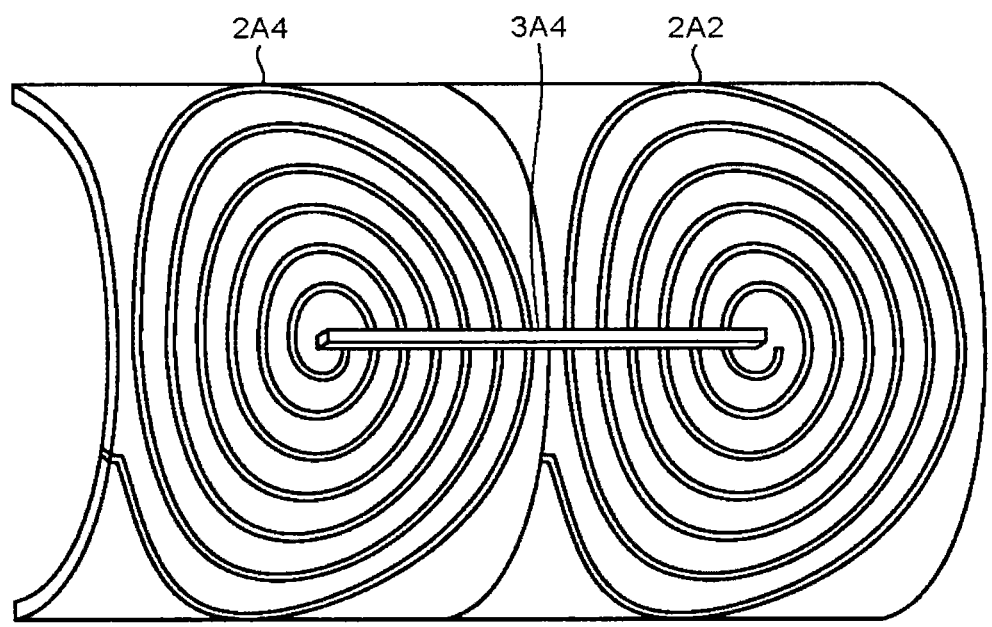
FIG. 4 is a diagram exemplifying a case in which central portions of respective coil members are connected by a crossover track according to the present embodiment.

FIG. 4 is a diagram exemplifying a case in which the central portions of respective coil members 2B are connected by the crossover tracks 3A and 3B according to the present embodiment. In FIG. 4, a state in which the coil member 2A4 and the coil member 2A2 are connected by the crossover track 3A4 viewed from the outer layer side is indicated as one example.

As indicated in FIG. 4, the crossover track 3A4 is arranged so as to connect the central portions of the coil member 2A4 and the coil member 2A2 on the outer layer side of the coil member 2A4 and the coil member 2A2 that are aligned to be layered. Surfaces of the coil member 2A4 and the coil member 2A2 are covered with an insulating material excluding the respective central portions. Thus, the crossover track 3A4 electrically connects the central portions of the coil member 2A4 and the coil member 2A2. Although a case in which the crossover tracks 3A and 3B are arranged on the outer layer side of the coil member 2 is explained herein for convenience of illustration, there is a case in which the crossover tracks 3A and 3B are arranged on the inner layer side of the coil member 2. Next, both of the cases are explained.

Figure 5A:
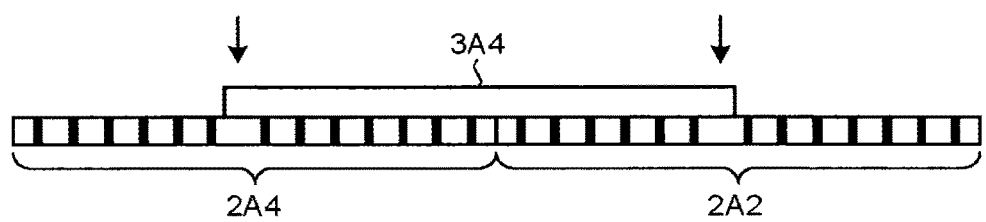
FIG. 5A is a cross section indicating a case in which the cross over track according to the present embodiment is arranged on an outer layer side of the coil member.
Figure 5B:
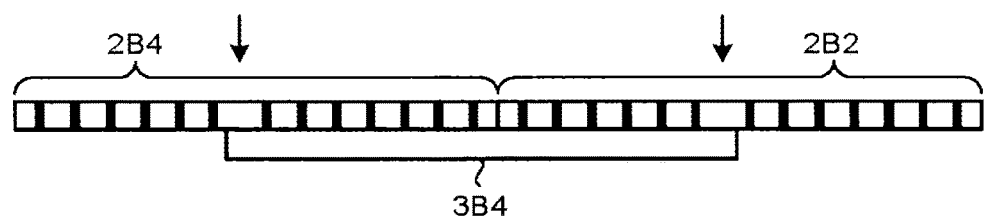
FIG. 5B is a cross section indicating a case in which the cross over track according to the present embodiment is arranged on an inner layer side of the coil member.

FIG. 5A is a cross section indicating a case in which the crossover tracks 3A and 3B according to the present embodiment are arranged on the outer layer side of the coil member 2. FIG. 5B is a cross section indicating a case in which the crossover tracks 3A and 3B according to the present embodiment are arranged on the inner layer side of the coil member 2. In FIG. 5A, a cross section of the crossover track 3A4 and the coil members 2A4 and 2A2 at a position at which the crossover track 3A4 is arranged is indicated as one example. In FIG. 5B, a cross section of the crossover track 3B4 and the coil members 2B4 and 2B2" at a position at which the crossover track 3A4 is arranged is indicated as one example. In FIG. 5A and FIG. 5B, an upper side of the drawing corresponds to the outer layer side of the cylinder, and a lower side of the drawing corresponds to the inner side of the cylinder.

As indicated in FIG. 5A, the crossover track 3A4 is arranged on the outer layer side of the coil members 2A4 and 2A2 (refer to FIG. 4). The crossover track 3A4 is fixed with screws from the outer layer side at positions indicated by arrows in the drawing. Moreover, as indicated in FIG. 5B, the crossover track 3B4 is arranged on the inner layer side of the coil members 2B4 and 2B2. The crossover track 3B4 is fixed with screws from the outer layer side at positions indicated by arrows in the drawing.

FIG. 5A and FIG. 5B only show one example. For example, although the case in which the crossover track 3A4 is arranged on the outer layer side is explained in FIG. 5A and the case in which the crossover track 3B4 is arranged on the inner layer side is explained in FIG. 5B, embodiments are not limited thereto. For example, whether the respective crossover tracks 3A4, 3A6, 3A8, 3A10, 3B4, 3B6, 3B8, and 3B10 are arranged on the outer layer side or the inner layer side of the respective coil members 2A and 2B may be changed appropriately.

The method of fastening the screws differs depending on whether the coil member 2 is arranged on the inner layer side of the crossover tracks 3A and 3B (case of FIG. 5A), or on the outer layer side (case of FIG. 5B). Next, methods of fastening screws in both of the cases are explained.

Figure 6:
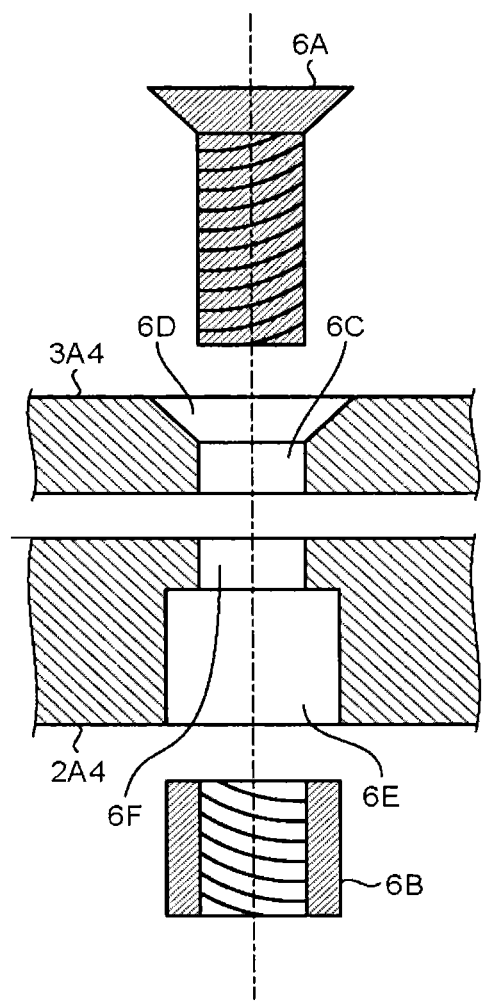
FIG. 6 is a diagram for explaining a method of fastening a screw when the coil member is arranged on an inner layer side of the crossover track.

When Arranging Coil Members 2A, 2B on Inner Layer Side of Crossover Tracks 3A, 3B FIG. 6 is a diagram for explaining a method of fastening a screw when the coil members 2A and 2B are arranged on the inner layer side of the crossover tracks 3A and 3B. In FIG. 6, a cross section of the crossover track 3A4 and the coil member 2A4 at a position at which a screw is fastened is indicated as one example.

In the example in FIG. 6, the crossover track 3A4 is formed with aluminum similarly to the coil member 2A4. Moreover, a male screw 6A and an insert nut 6B are formed with a nonmagnetic metal (for example, copper, brass, stainless steel, or the like) that is different from aluminum. Furthermore, inside the insert nut 6B, a female screw corresponding to the male screw 6A is formed. The crossover track 3A4, the male screw 6A, and the insert nut 6B are one example of a connecting member.

In the crossover track 3A4, a hole 6C and a hole 6D are formed. The hole 6C is formed on the inner layer side of the crossover track 3A4, and has a shape in which a stem of the male screw 6A passes through. The hole 6D is formed on the outer layer side of the crossover track 3A4, and has a shape that matches with a top part of the male screw 6A.

In the coil member 2A4, a hole 6E and a hole 6F are formed. The hole 6E is formed on the inner layer side of the coil member 2A4, and the insert nut 6B is inserted thereto from the inner layer side. The hole 6F is formed on the outer layer side (a connection surface side with the crossover track 3A4) of the coil member 2A4, and has a shape in which the stem of the male screw 6A passes through.

First, on a contact surface on which the crossover track 3A4 and the coil member 2A4 come in contact with each other, an electrically conductive compound (grease) is applied. The male screw 6A is then inserted into the hole 6E piercing through the hole 6D, the hole 6C, and the hole 6F. Subsequently, the male screw 6A is inserted to be fixed along the female screw of the insert nut 6B that has been inserted into the hole 6E. Moreover, the crossover track 3A4 is also connected with the coil member 2A2 similarly to the coil member 2A4 (refer to FIG. 5A).

In other words, when the coil member 2A4 is connected with another part (for example, the crossover track 3A4) with the male screw 6A, and when a distance from the top part of the male screw 6A is longer than the other part, the insert nut 6B that is the second nonmagnetic metal in which the female screw corresponding to the male screw 6A is formed is inserted as a connecting member.

As described, the crossover track 3A4, the male screw 6A, and the insert nut 6B connect the coil member 2A4 and the coil member 2A2. Thus, in the gradient magnetic-field coil 103, the coil member 2A4 and the coil member 2A2 can be electrically connected by screws without forming a female screw in the coil members 2A and 2B that are formed with aluminum.

Although a case in which the coil member 2A4 and the coil member 2A2 are connected is explained as one example, embodiments are not limited thereto. That is, the method indicated in FIG. 6 is applicable to a case in which the crossover tracks 3A and 3B connect the coil members 2A and 2B that are arranged on the inner layer side of the crossover tracks 3A and 3B.

Figure 7A:
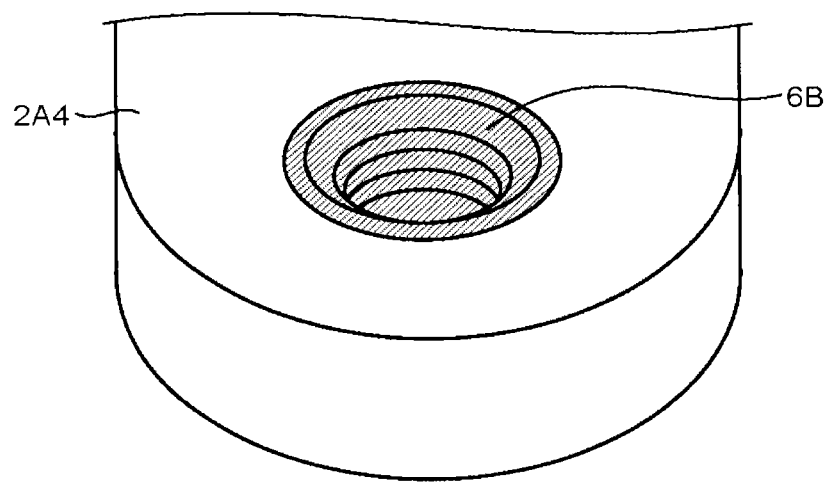
FIG. 7A is a perspective view of the central portion of the coil member viewed from the inner layer side.
Figure 7B:
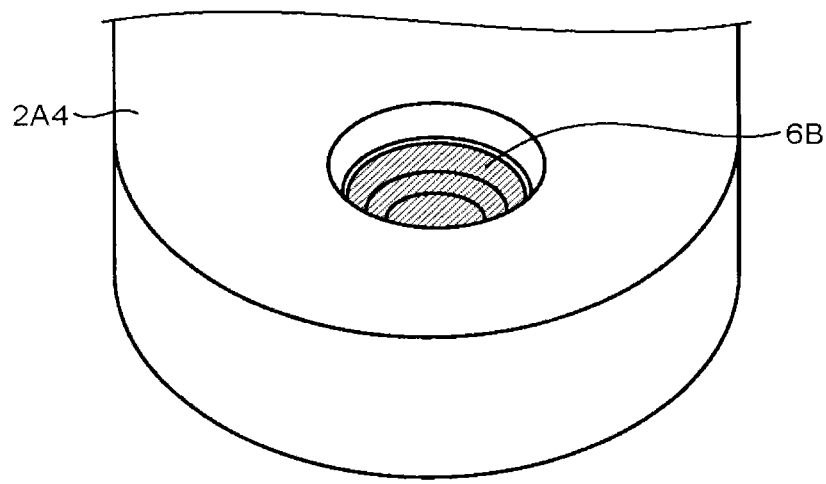
FIG. 7B is a perspective view of the central portion of the coil member viewed from the outer layer side.

Furthermore, the insert nut 6B according to the present embodiment is inserted into the hole 6E arranged inner layer side of the coil member 2A4. In addition, the hole 6F piercing through toward the outer layer side from this hole GE has a smaller interior diameter than the hole 6E, and has a shape (size) that the insert nut 6B does not fit. Accordingly, the insert nut 6B is exposed on the inner layer side of the coil member 2A4 (refer to FIG. 7A) but not exposed on the outer layer side (refer to FIG. 7B). That is, the insert nut 6B has a structure that does not pierce through to the outer layer side of the coil member 2A4. Therefore, the insert nut 6B is prevented from falling off from the coil member 2A4 in a state being fastened with the male screw 6A, for example. FIG. 7A is a perspective view of the central portion of the coil member 2A4 viewed from the inner layer side, and FIG. 7B is a perspective view of the central portion of the coil member 2A4 viewed from the outer layer side.

Moreover, on a contact surface on which the coil members 2A, 2B and the crossover tracks 3A, 3B come in contact with each other, an electrically conductive compound is applied. Thus, the gradient magnetic-field coil 103 is enable to remove oxide films that are formed on surfaces of the coil members 2A, 2B and the crossover tracks 3A, 3B (aluminum), and to prevent reforming of an oxide film, thereby preventing increase of contact resistance.

Figure 8:
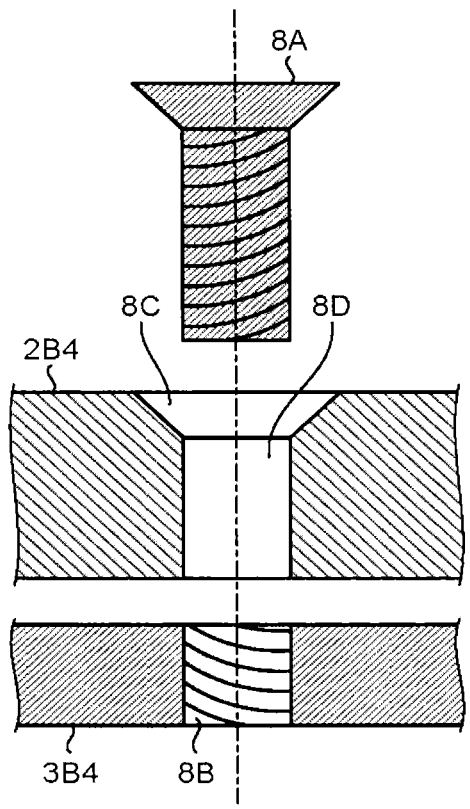
FIG. 8 is a diagram for explaining a method of fastening a screw when the coil member is arranged on an outer layer side of the crossover track.

When Arranging Coil Members 2A, 2B on Outer Layer Side of Crossover Tracks 3A, 3B FIG. 8 is a diagram for explaining a method of fastening a screw when the coil members 2A and 2B are arranged on the outer layer side of the crossover tracks 3A and 3B. In FIG. 8, a cross section of the crossover track 3B4 and the coil member 2B4 at a position at which a screw is fastened is indicated as one example.

In the example in FIG. 8, the crossover track 3B4 and a male screw 8A are formed with a nonmagnetic metal (for example, copper, brass, stainless steel, or the like different from aluminum. The crossover track 3B4 and the male screw 8A are one example of a connecting member.

In the crossover track 3B4, a hole 8B is formed. The hole 8B has a shape that pierces through the crossover track 3B4 and in which a stem of the male screw 8A passes through. Inside the hole 8B, a female screw corresponding to the male screw 8A is formed.

In the coil member 2B4, a hole 8C and a hole 8D are formed. The hole 8C is formed on the outer layer side of the coil member 2B4, and has a shape that matches with a top part of the male screw 8A. The hole 8B is formed on the inner layer side of the coil member 2B4, and has a shape in which the stem of the male screw 8A passes through.

First, on a contact surface on which the crossover track 3B4 and the coil member 2B4 come in contact with each other, an electrically conductive compound is applied. The male screw 8A is then inserted into the hole 8B piercing through the hole 8C and the hole 8D. Subsequently, the male screw 8A is inserted to be fixed along the female screw of the hole 8B. Moreover, the crossover track 3B4 is also connected with the coil member 2B2 similarly to the coil member 2B4 (refer to FIG. 5B).

As described, the crossover track 3B4 and the male screw BA connect the coil member 2B4 and the coil member 2B2. Thus, in the gradient magnetic-field coil 103, the coil member 2B4 and the coil member 2B2 can be electrically connected by screws.

Although a case in which the coil member 2B4 and the coil member 2B2 are connected is explained as one example, embodiments are not limited thereto. That is, the method indicated in FIG. 8 is applicable to a case in which the crossover tracks 3A and 3B connect the coil members 2A and 2B that are arranged on the outer layer side of the crossover tracks 3A and 3B.

Moreover, on a contact surface on which the crossover tracks 3A, 3B and the coil members 2A, 2B come in contact with each other, an electrically conductive compound is applied. Thus, the gradient magnetic-field coil 103 is enable to remove oxide films that are formed on surfaces of the coil members 2A and 2B, and to prevent reforming of an oxide film, thereby preventing increase of contact resistance.

When Connecting Ends of Coil Members 2A, 2B and Crossover Tracks 3A, 3B

A case in which ends of the coil members 2A and 2B, and the crossover tracks 3A and 3B are connected is explained. As one example, a case in which the coil member 2A2 and the crossover track 3A5 are connected is explained herein. In this case, the crossover track 3A5 is formed with a nonmagnetic metal (for example, copper, brass, stainless steel, or the like) different from aluminum. The coil member 2A2 and the crossover track 3A5 are connected by screws by a method similar to the method indicated in FIG. 8.

Specifically, first, on a contact surface on which the crossover track 3A5 and the coil member 2A2 come in contact with each other, an electrically conductive compound is applied. A male screw then inserted into the crossover track 3A5 piercing through a hole that is formed in the coil member 2A2. Subsequently, the male screw is inserted to be fixed along a female screw of the crossover track 3A5. Moreover, the crossover track 3A5 is also connected with the coil member 2A6 similarly to the coil member 2A2 (refer to FIG. 3A).

As described, the crossover track 3A5 and the male screw connect the coil member 2A2 and the coil member 2A6. Thus, in the gradient magnetic-field coil 103, the coil member 2A2 and the coil member 2A6 can be electrically connected by screws.

Although a case in which the coil member 2B4 and the coil member 2B2 are connected is explained as one example, embodiments are not limited thereto. That is, the method indicated in FIG. 8 is applicable to a case in which the crossover tracks 3A and 3B connect the coil members 2A and 2B that are arranged on the outer layer side of the crossover tracks 3A and 3B.

Moreover, on a contact surface on which the crossover tracks 3A, 3B and the coil members 2A, 2B come in contact with each other, an electrically conductive compound is applied. Thus, the gradient magnetic-field coil 103 is enable to remove oxide films that are formed on surfaces of the coil members 2A and 2B, and to prevent reforming of an oxide film, thereby preventing increase of contact resistance.

Structure of Z Coil

Figure 9:
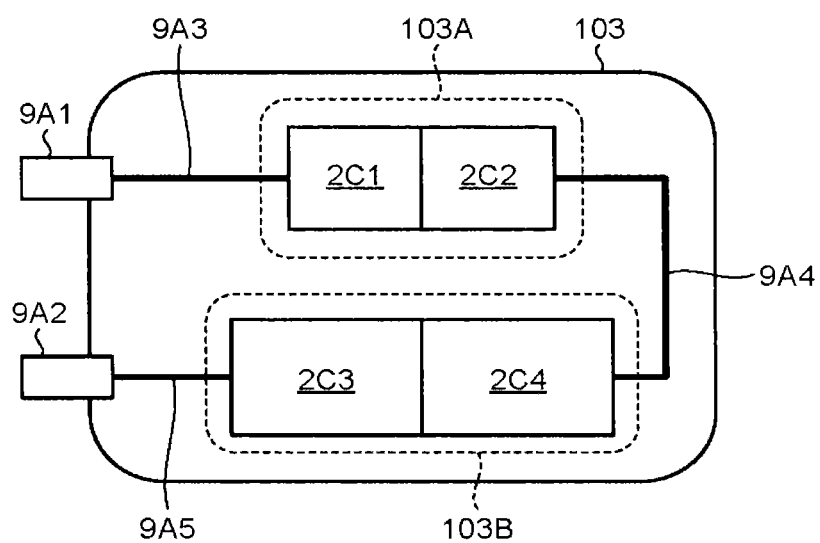
FIG. 9 is a diagram for explaining connection of each coil member in the Z coil according to the present embodiment.

FIG. 9 is a diagram for explaining connection of each coil member in the Z coil according to the present embodiment. In FIG. 9, connection relation of the respective coil members 2C is schematically indicated.

As indicated in FIG. 9, the respective coil members 2C are connected to the gradient-field power supply 104 through terminals 9A1 and 9A2. The terminal 9A1 and the coil member 2C1 are connected through a crossover track 9A3. The coil member 2C1 and the coil member 2C2 are directly connected. The coil member 2C2 and the coil member 2C4 are connected through a crossover track 9A4. The coil member 2C4 and the coil member 2C3 are directly connected. The coil member 2C3 and the terminal 9A2 are connected through a crossover track 9A5. In the following, the respective crossover tracks 9A3, 9A4, and 9A5 that connect the respective coil members 2C are referred to as a "crossover track 9A" when generally referred without distinguishing each. Moreover, the crossover track 9A is one example of a connecting member.

Figure 10:
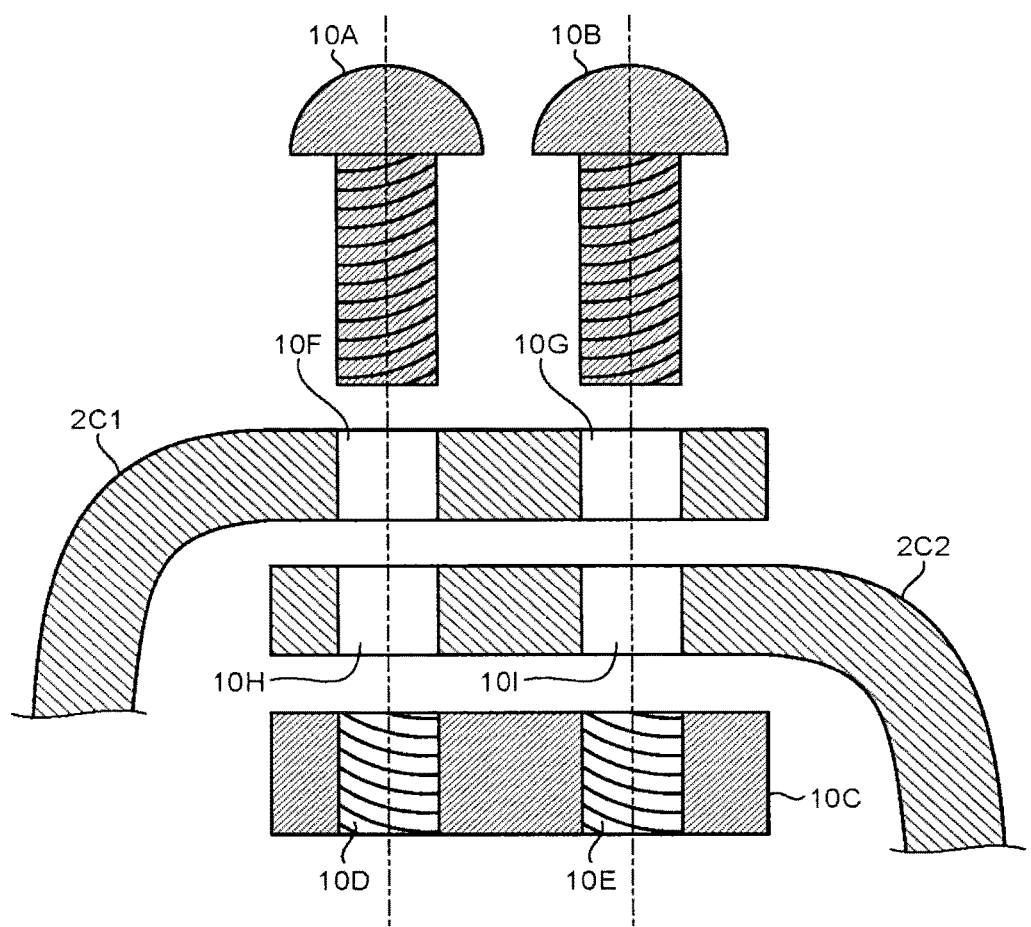
FIG. 10 is a diagram for explaining connection of the coil member according to the present embodiment.

FIG. 10 is a diagram for explaining connection of the coil member 2C according to the present embodiment. In FIG. 10, a cross section of the coil member 2C1 and the coil member 2C2 at a connecting position is indicated as one example.

In the example in FIG. 10, male screws 10A, 10B, and a plate member 10C are formed with a nonmagnetic metal (for example, copper, brass, stainless steel, or the like) different from aluminum. The plate member 10C has a hole 10D and a hole 10E. The hole 10D and the hole 10E pierce through the plate member 10C, and has a shape in which the respective male screws 10A and 10B pass through. Inside the hole 10D and the hole 10E, respective female screws corresponding to the male screws 10A and 10B are formed.

In the coil member 2C1, a hole 10F and a hole 10G are formed, and in the coil member 2C2, a hole 10H and a hole 10I are formed. The respective holes 10F, 10G, 10H, and 10I pierce through the respective coil members 2C, and have a shape in which stems of the respective male screws 10A and 10E pass through.

First, on a contact surface on which the coil member 2C1 and the coil member 2C2 come in contact with each other, an electrically conductive compound is applied. The male screw 10A is then inserted into the hole 10D piercing through the hole 10F and the hole 10H. Subsequently, the male screw 10A is inserted to be fixed along the female screw that is formed inside the hole 10D. Furthermore, the male screw 10B is inserted into the hole 10E piercing through the hole 10G and the hole 10I. Subsequently, the male screw 10B is inserted to be fixed along the female screw that is formed inside the hole 10E.

As described, the coil member 2C1 and the coil member 2C2 are electrically connected with each other. Thus, in the gradient magnetic-field coil 103, the coil members 2C that are formed with aluminum can be electrically connected by screws.

FIG. 10 only shows one example. For example, the coil member 2C1 and the coil member 2C2 may be formed by processing an unbroken single conductive wire into a spiral form.

As described above, in the MRI apparatus 100 according to the present embodiment, the gradient magnetic-field coil 103 includes multiple units of the coil members 2 and a connecting member to connect the coil members 2 with each other formed with aluminum. Moreover, the connecting member includes a nonmagnetic-metal connecting member formed with a nonmagnetic metal different from aluminum in at least a part thereof. Therefore, in the MRI apparatus 100, the gradient magnetic-field coil 103 can be formed lightweight.

For example, in the gradient magnetic-field coil 103, when a female screw for connection is formed in the coil member 2 (refer to FIG. 5A, FIG. 6, and the like), the insert nut 6B that is inserted into the coil member 2 is used as the nonmagnetic-metal connecting member. Therefore, in the gradient magnetic-field coil 103, the coil member 2 formed with aluminum for which a female screw is difficult to be formed can be used for screw fastening.

Moreover, for example, in the gradient magnetic-field coil 103, the hole 6F and the hole 6E that has a larger diameter than the hole 6F are formed in the coil member 2 so as to pierce through the coil member 2. The hole 6F is formed on the connection surface side on which it is connected by a female screw. To the hole 6E, the insert nut 6B is inserted. Therefore, in the gradient magnetic-field coil 103, the insert nut 6B is prevented from falling off to the connection surface side from the coil member 2A4 in a state being fastened with the male screw 6A.

Furthermore, for example, in the gradient magnetic-field coil 103, when a female screw for connection is formed in a connecting wire that is connected to the coil member 2 (refer to FIG. 5B, FIG. 8, and the like), the connecting wire is the nonmagnetic-metal connecting member. Therefore, in the gradient magnetic-field coil 103, the coil member 2 and the connecting wire can be connected by screws.

Moreover, for example, in the gradient magnetic-field coil 103, when the coil members 2 are connected, and a female screw for connection is formed in a plate member that is a separate member from the coil members 2 (refer to FIG. 10), the plate member is the nonmagnetic-metal connecting member. Therefore, in the gradient magnetic-field coil 103, the coil members 2 formed with aluminum can be connected with each other by screws.

Furthermore, in the gradient magnetic-field coil 103, on a connection surface on which the coil member 2 is connected with another part, an electrically conductive abrasive (compound) is applied. Therefore, the gradient magnetic-field coil 103 is enabled to remove oxide films that are formed on surfaces of the coil members 2, and to prevent reforming of an oxide film, thereby preventing increase of contact resistance. Moreover, by fastening with screws using this compound, the gradient magnetic-field coil 103 is enabled to connect the respective members without using soldering that is unsuitable for connection of aluminum.

Modification

Furthermore, for example, in the gradient magnetic-field coil 103, the crossover tracks 3 that are connected to the coil members 2 may be formed with aluminum.

Figure 11:
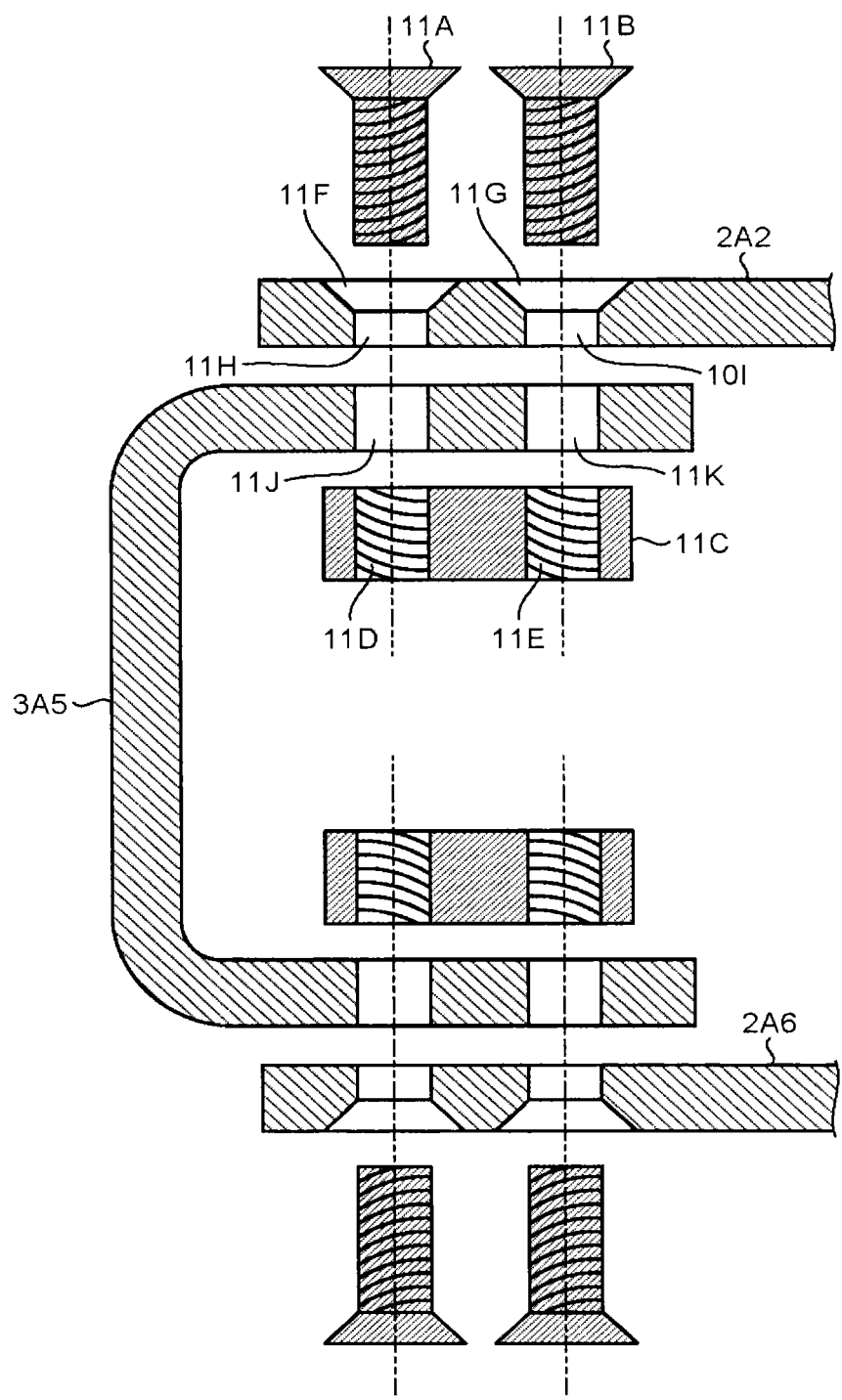
FIG. 11 is a diagram for explaining connection of a crossover track formed with aluminum.

FIG. 11 is a diagram for explaining connection of the crossover track 3 that is formed with aluminum. In FIG. 11, a cross section of the crossover track 3A5 and the coil members 2A2 and 2A6 at a position at which screws are fastened is indicated as one example.

In the example in FIG. 11, the crossover track 3A5 is formed with aluminum. Moreover, a male screws 11A and 11B, and a plate member 11C are formed with a nonmagnetic metal (for example, copper, brass, stainless steel, or the like) different from aluminum. The plate member 11C has a hole 11D and a hole 11E. The hole 11D and the hole 11E pierce through the plate member 11C, and have a shape in which stems of the respective male screws 11A and 11B pass through. Inside the hole 11D and the hole 11E, respective female screws corresponding to the respective male screws 11A and 11B are formed.

In the coil member 2A2, a hole 11F, a hole 11G, a hole 11H, and a hole 11I are formed. The respective holes 11F, 11G, 11H, and 11I pierce through the coil member 2A2, and have a shape in which the stems of the male screws 11A and 11D pass through.

In the crossover track 3A5, a hole 11J and a hole 11K are formed. The respective holes 11J and 11K pierce through the crossover track 3A5, and have a shape in which stems of the respective male screws 11A and 11B pass through.

First, on a contact surface on which the coil member 2A2 and the crossover track 3A5 come in contact with each other, an electrically conductive compound is applied. The male screw 11A is then inserted into the hole 11D piercing through the hole 11F, the hole 11H, and the hole 11J. Subsequently, the male screw 11A is inserted to be fixed along the female screw that is formed inside the hole 11D. Furthermore, the male screw 11B is inserted into the hole 11E piercing through the hole 11G, the hole 11I, and the hole 11K. Subsequently, the male screw 11B is inserted to be fixed along the female screw that is formed inside the hole 11E.

As described, the coil member 2A2 and the crossover track 3A5 are electrically connected with each other. Similarly, the coil member 2A6 and the crossover track 3A5 are electrically connected with each other. That is, in the gradient magnetic-field coil 103, when the connecting wire that is connected to the coil member 2 is formed with aluminum, and a female screw for connection is formed in the plate member that is a separate member from the connecting wire (FIG. 11), the plate member is the nonmagnetic-metal connecting member. Therefore, the gradient magnetic-field coil 103 is enabled to connect the coil member 2 that is formed with aluminum and the connecting wire that is formed with aluminum by screws.

Note that it is not limited to the embodiments described above. For example, the number of male screws used for screw fastening may be changed appropriately. Moreover, the shape of a top part of male screws may also be changed appropriately.

Material of Coil Member

Furthermore, although a case in which the coil member 2 is formed with aluminum has been explained in the embodiment described above, embodiments are not limited thereto. For example, the coil member 2 may be formed with a nonmagnetic metal (for example, copper, brass, stainless steel, or the like) other than aluminum. In this case, for a connecting member such as the insert nut 6B (FIGS. 6, 7A, 7B), the crossover track 3A4 (FIG. 8), the plate member 10C (FIG. 10), and the plate member 11C (FIG. 11), a nonmagnetic metal that is different from a nonmagnetic metal used as a material of the coil member 2 is used.

In other words, the gradient magnetic-field coil 103 according to an embodiment includes multiple units of the coil members 2 and the connecting member. For each of the coil members 2, a coil pattern is formed with a first nonmagnetic metal. The connecting member connects the coil members 2 with each other. Moreover, as for the connecting member, at least a part thereof is formed with a second nonmagnetic metal that is a different kind from the first nonmagnetic metal. Accordingly, in the gradient magnetic-field coil 103, various kinds of nonmagnetic metals can be used appropriately as a material of the coil members 2.

For example, there is a case in which a material comparatively softer than other nonmagnetic metals like aluminum is demanded to be used as a material of the coil member 2 that enables to form the gradient magnetic-field coil 103 lightweight and at low cost. In such a case, depending on the degree of softness, there is a case in which required fastening strength cannot be obtained usually, even if a female screw is formed in that material.

However, in the gradient magnetic-field coil 103 according to the present embodiment, a female screw is not formed in the coil members 2. That is, in the gradient magnetic-field coil 103, when the coil member 2 and the other part are fastened by screws, a connecting member that is formed with a nonmagnetic metal harder than the material of the coil member is used to screw. In other words, the first nonmagnetic metal that is the material of the coil member 2 is a nonmagnetic metal softer than the second nonmagnetic metal that is the material of the connecting member. Therefore in the gradient magnetic-field coil 103, a soft nonmagnetic metal can be used as a material of the coil member. Thus, various kinds of nonmagnetic metals can be used as a material of the coil member 2 for the gradient magnetic-field coil 103, and therefore, various effects applied materials can be obtained. For example, by forming the coil member 2 with aluminum, the gradient magnetic-field coil 103 can be formed lightweight and at low cost.

According to at least one of the embodiments explained above, the gradient magnetic-field coil can be formed lightweight.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A gradient magnetic-field coil, comprising:
   a first coil member formed with a first nonmagnetic metal;
   a male screw electrically connected to the first coil member;
   an insert nut corresponding to the male screw and being electrically connected to the male screw, at least one of the male screw and the insert nut being formed with a second nonmagnetic metal that is different from the first nonmagnetic metal; and
   a second coil member formed with the first nonmagnetic metal and being electrically connected to the insert nut.

2. The gradient magnetic-field coil according to claim 1, wherein the first nonmagnetic metal is a nonmagnetic metal that is softer than the second nonmagnetic metal.

3. The gradient magnetic-field coil according to claim 1, wherein the first nonmagnetic metal is aluminum.

4. The gradient magnetic-field coil according to claim 1, wherein
   the insert nut is formed with the second nonmagnetic metal.

5. The gradient magnetic-field coil according to claim 4, wherein
   a first hole and a second hole that has a larger diameter than the first hole are formed so as to pierce through the first coil member and the second coil member, and the first hole is formed on a connection surface side connected with the male screw, and the insert nut is inserted to the second hole.

6. The gradient magnetic-field coil according to claim 1, wherein when a female screw for connection is formed in a connecting wire that is connected to at least one of the first coil member and the second coil member, the connecting wire is formed with the second nonmagnetic metal.

7. The gradient magnetic-field coil according to claim 1, wherein when a connecting wire that is connected to at least one of the first coil member and the second coil member is formed with aluminum and a female screw for connection is formed in a plate member that is a separate member from the connecting wire, the plate member is formed with the second nonmagnetic member.

8. The gradient magnetic-field coil according to claim 1, wherein when the first coil member and the second coil member are connected with each other and a female screw for connection is formed in a plate member that is a separate member from at least one of the first coil member and the second coil member, the plate member is formed with the second nonmagnetic member.

9. The gradient magnetic-field coil according to claim 1, wherein on a connection surface on which the first coil member or the second coil member is connected with another part, an electrically conductive abrasive is applied.

10. A magnetic-resonance imaging apparatus comprising the gradient magnetic-field coil according to claim 1.

11. A magnetic-resonance imaging apparatus comprising the gradient magnetic-field coil according to claim 2.

12. A magnetic-resonance imaging apparatus comprising the gradient magnetic-field coil according to claim 3.

13. A magnetic-resonance imaging apparatus comprising the gradient magnetic-field coil according to claim 4.

14. A magnetic-resonance imaging apparatus comprising the gradient magnetic-field coil according to claim 5.

15. A magnetic-resonance imaging apparatus comprising the gradient magnetic-field coil according to claim 6.

16. A magnetic-resonance imaging apparatus comprising the gradient magnetic-field coil according to claim 7.

17. A magnetic-resonance imaging apparatus comprising the gradient magnetic-field coil according to claim 8.

18. A magnetic-resonance imaging apparatus comprising the gradient magnetic-field coil according to claim 9.

* * * * *